United States Patent [19]
Yang

[11] Patent Number: 6,075,709
[45] Date of Patent: Jun. 13, 2000

[54] MEMORY ADAPTER

[76] Inventor: Li-Ho Yang, 4th Fl., No. 99-4, Tung-an St., Taipei, Taiwan

[21] Appl. No.: 09/111,949

[22] Filed: Jul. 8, 1998

[51] Int. Cl.[7] ...................................................... H05K 5/00
[52] U.S. Cl. ............................ 361/756; 361/736; 361/737; 361/759; 361/800; 361/801; 361/802; 439/76.1
[58] Field of Search ..................................... 361/756, 736, 361/737, 741, 747, 752, 800–802; 439/76.1

[56] References Cited

U.S. PATENT DOCUMENTS

| | | | |
|---|---|---|---|
| 4,912,602 | 3/1990 | Zarek et al. | 361/752 |
| 4,945,448 | 7/1990 | Bremenour et al. | 361/684 |
| 5,420,759 | 5/1995 | Charlier et al. | 361/814 |
| 5,838,542 | 11/1998 | Nelson et al. | 361/704 |
| 5,838,548 | 11/1998 | Matz et al. | 361/784 |

*Primary Examiner*—Leo P. Picard
*Assistant Examiner*—Tuan Dinh
*Attorney, Agent, or Firm*—Kirkpatrick & Lockhart LLP

[57] ABSTRACT

A memory adapter having a first cover (50), a circuit board (60), a second cover (70) detachably connected the circuit board (60) to the first cover (50) and a third cover (80) detachably connected with the first cover (50) and abutted the second cover (70) toward the first cover (50) is used by users to adapt to different cassette memory of different sizes. With the adapter, users are able to use cassette memory of different dimensions in different electrical appliance readily.

6 Claims, 5 Drawing Sheets

MEMORY ADAPTER

BACKGROUND OF THE INVENTION

1. Field of the Invention

The present invention relates to a memory adapter, and more particularly to a memory adapter adapted to receive a cassette memory which is used to store digital information therein. The memory adapter having an adapter received therein is designed to be electrically connected with the cassette memory on a first end thereof and a connector on a second end thereof, such that the memory adapter is able to electrically connect the cassette memory of a smaller size with a socket of a larger size.

2. Background

A cassette memory is used to store therein digital information which is applicable in various fields, such as personal computer, digital recorder, digital camera, etc. The introduction of different cassette memory facilitates the exchange of information of different formats. Referring to FIG. 8, when the cassette memory 20 is in use, it must securely attach to a connector 10 securely and electrically connected with an electrical appliance, such as a personal computer (not shown). The connector 10 has two substantially U-shaped, oppositely designed tracks 11 respectively formed on each one of two opposed arms (not numbered) and a plurality of pins 12 securely inserted through a bottom thereof. The cassette memory 20 has two opposite flanges 21 respectively formed on each one of two opposed sides thereof and corresponding to one of the tracks 11 and a plurality of through holes 22 defined in a bottom thereof and each corresponding to one of the pins 12 of the connector 10. In combination with the connector 10, the memory cassette 20 is able to transmit digital information stored therein to other electrical appliance readily.

However, since the physical configurations of different memory cassettes vary greatly, users often have to go through a lot of steps to transform the digital information when needed. Person skilled in the art will appreciate that there is no production standard for the size of memory cassettes, therefore, it is almost impossible to find compatibility between two cassette memories of different brands, which causes the users to go through a lot of steps and procedures to transform the information. Due to the steps and procedures necessary to transform the information, users will waste a lot of time and energy to process the information before it becomes available.

The present invention provides an improved memory adapter to obviate and/or mitigate the aforementioned problems.

SUMMARY OF THE INVENTION

The primary object of the invention is to provide an improved memory adapter. The memory adapter has a top cover adapted to have two oppositely disposed flanges each corresponding to one of the tracks of a connector and a plurality of through holes defined in an end of a circuit board detachably received within the adapter. With the arrangement as described above, cassette memories of different sizes are able to be electrically connected with the memory adapter and the information stored within the memory cassette is, therefore, able to be transmitted directly to other electrical appliance without going through endless procedures to transform the digital information of the cassette memory.

Another object of the invention is to provide an orientation limit within the adapter so that correct orientation of the cassette memory while being inserted into the memory adapter is ensured.

Other novel features and advantages of the invention will become more apparent from the following detailed description when taken in conjunction with the accompanying drawings.

Figure 1:
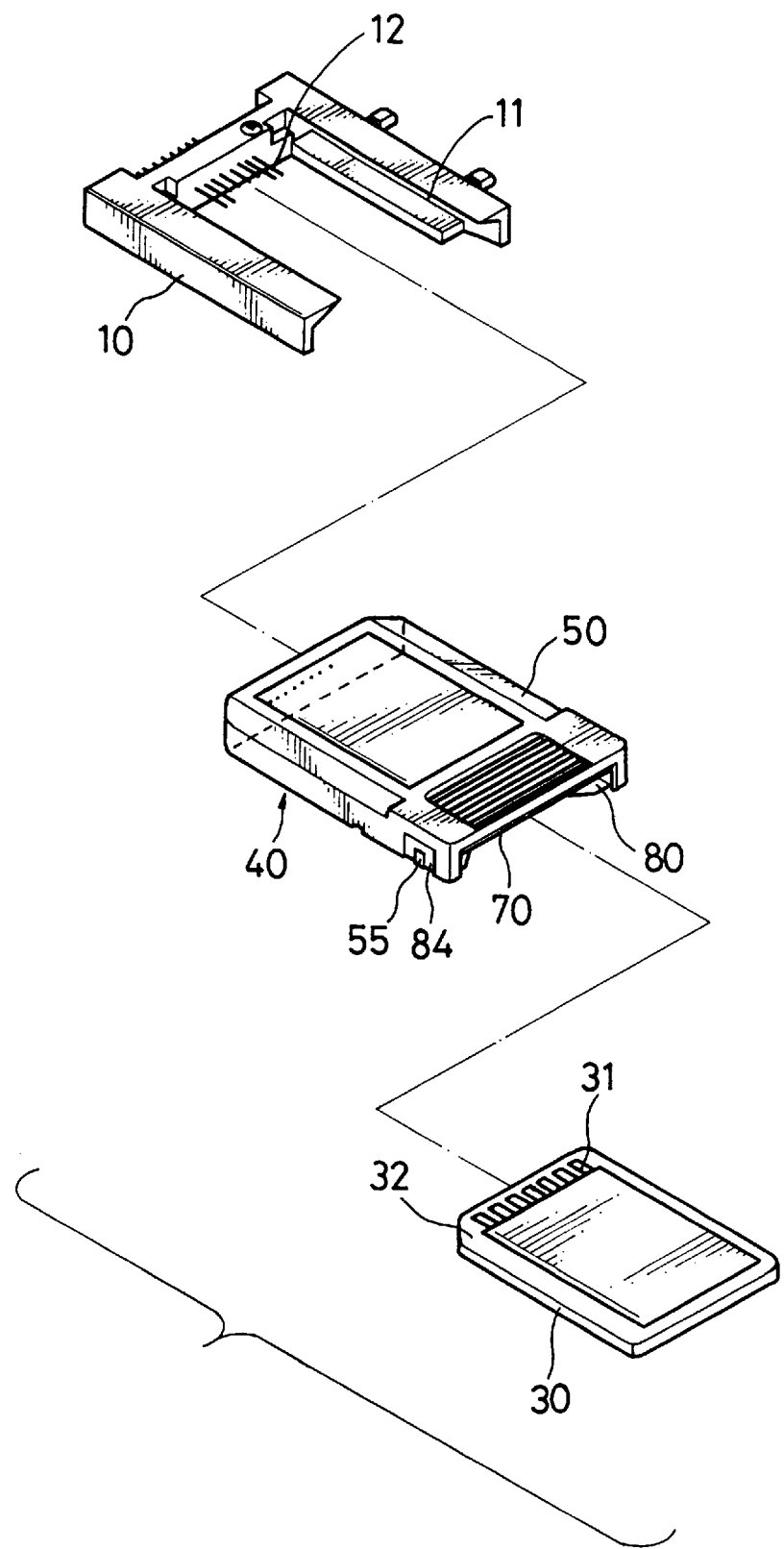
FIG. 1 is a schematic view showing the corporation of the present invention with a conventional connector and a cassette memory.
Figure 2:
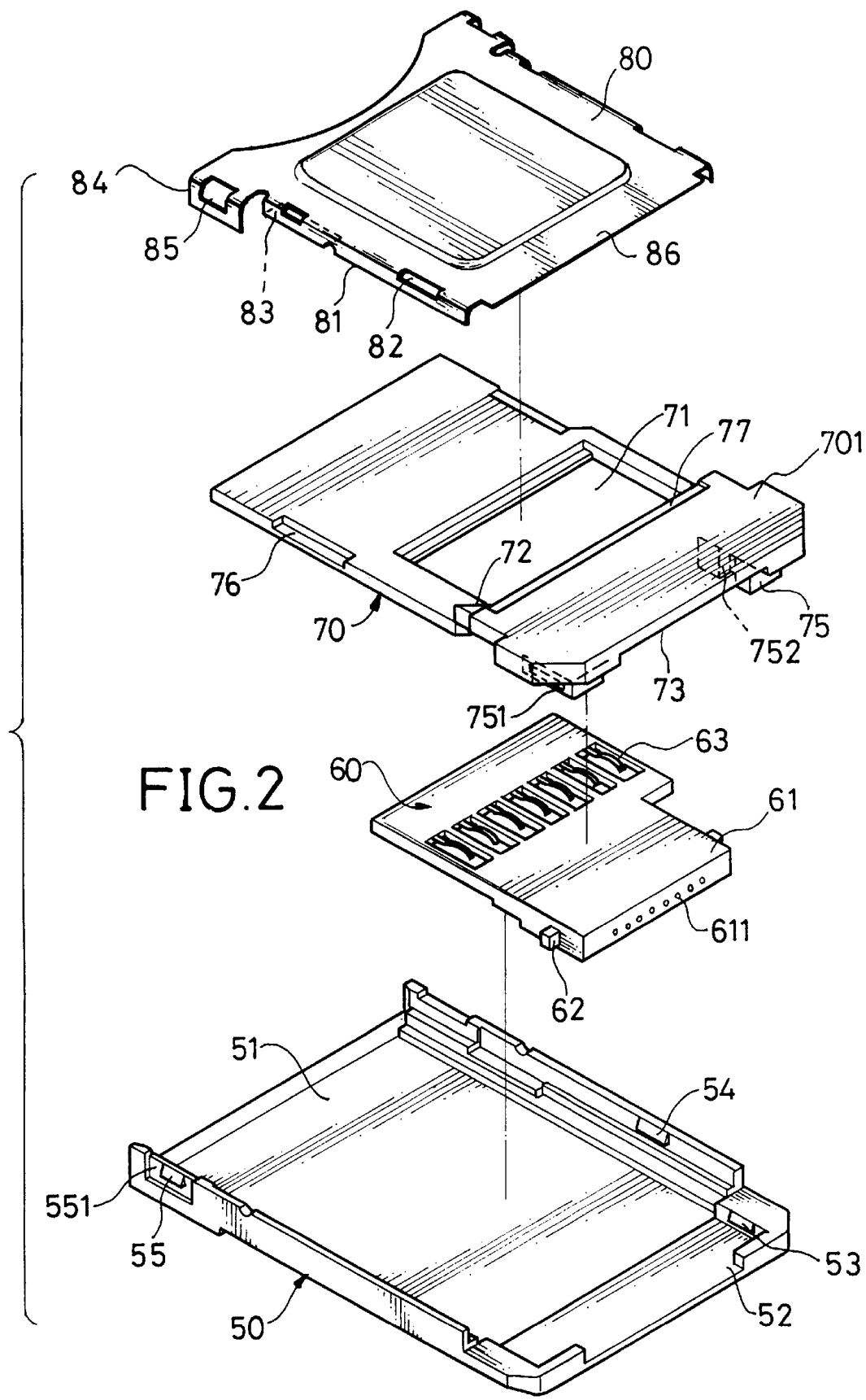
FIG. 2 is a bottom exploded view of the memory adapter shown in FIG. 1.
Figure 3:
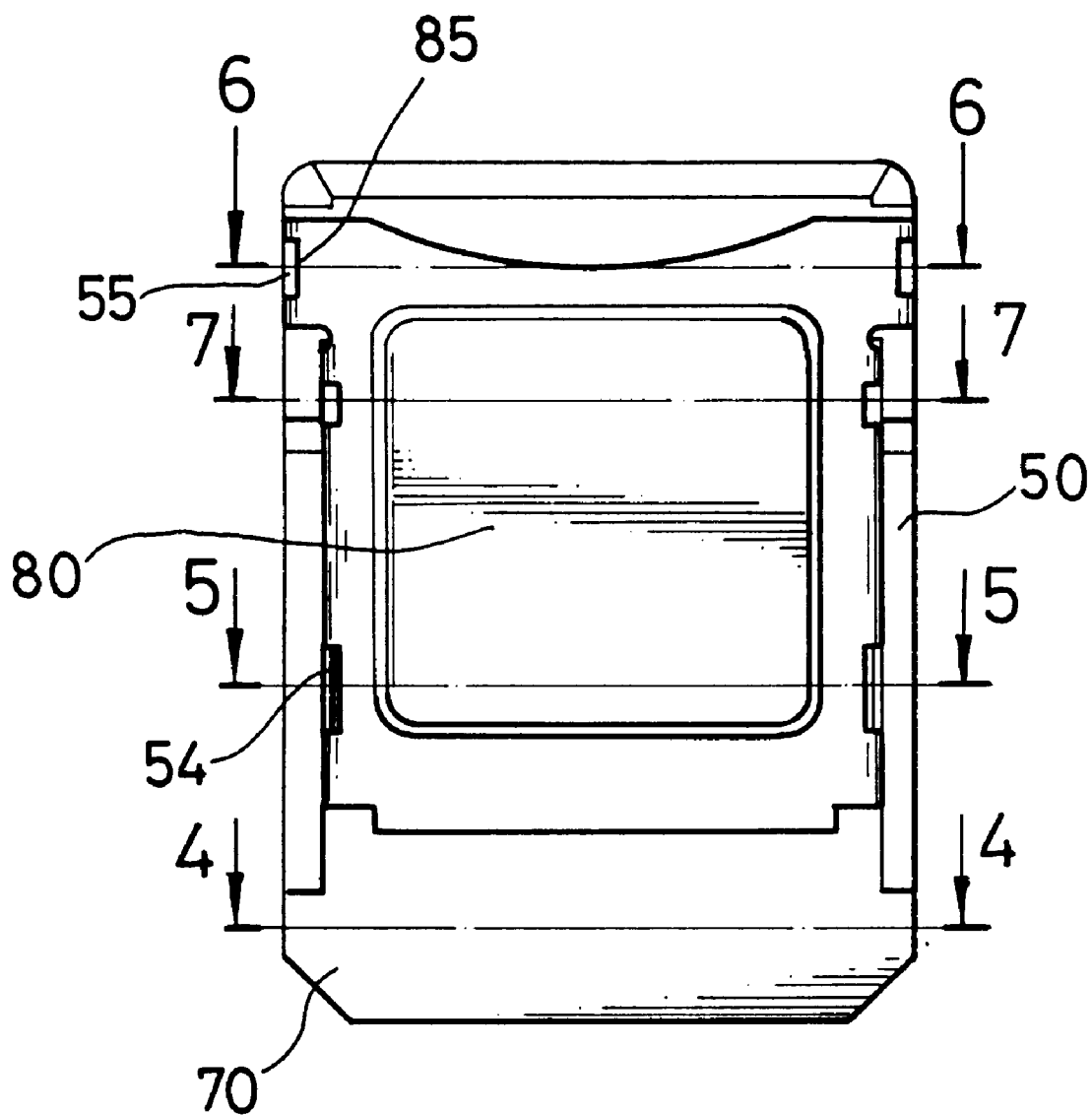
FIG. 3 is a schematic plan view of the cassette memory shown in FIG. 1.
Figure 4:
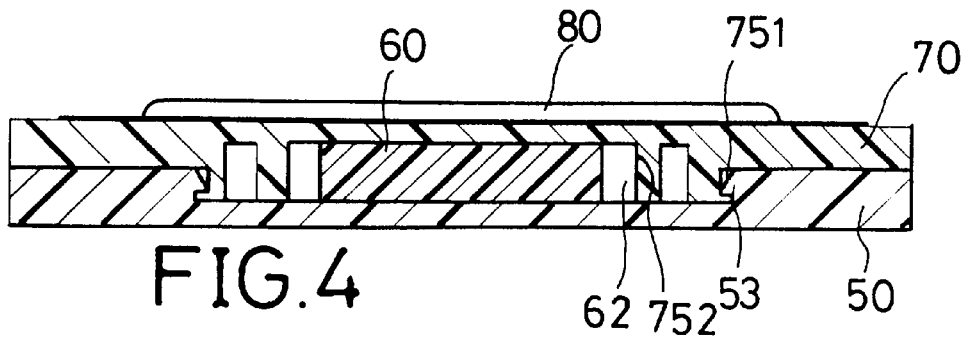
FIG. 4 through FIG. 7 are cross sectional views of the cassette memory shown in FIG. 4.
Figure 5:
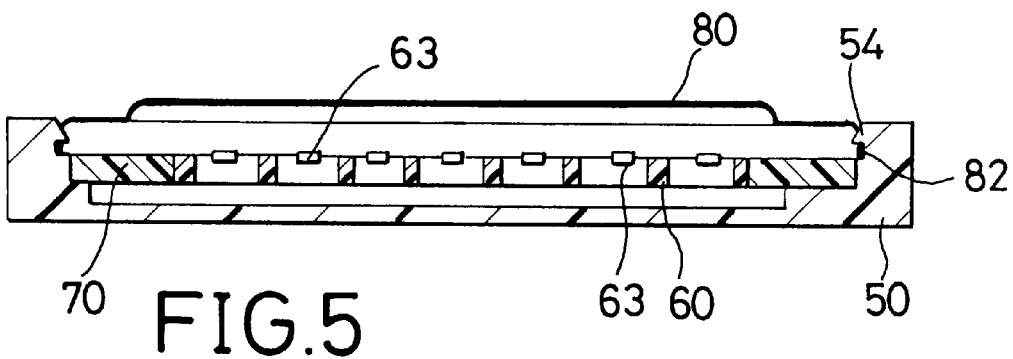
Figure 6:
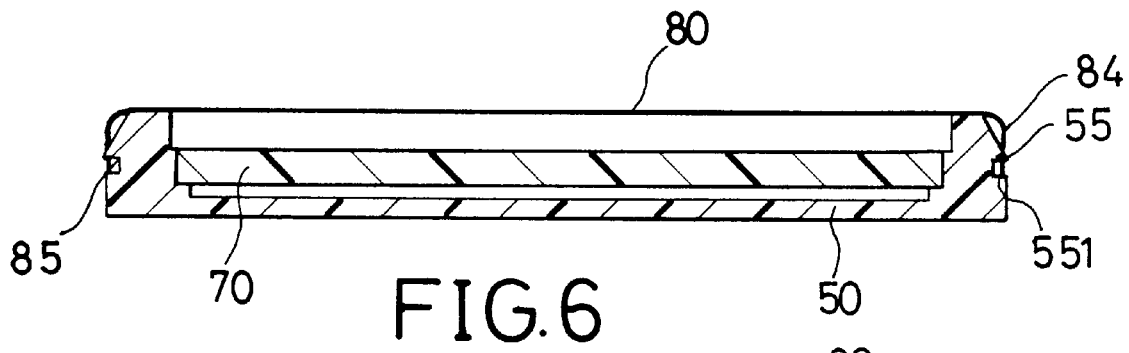
Figure 7:
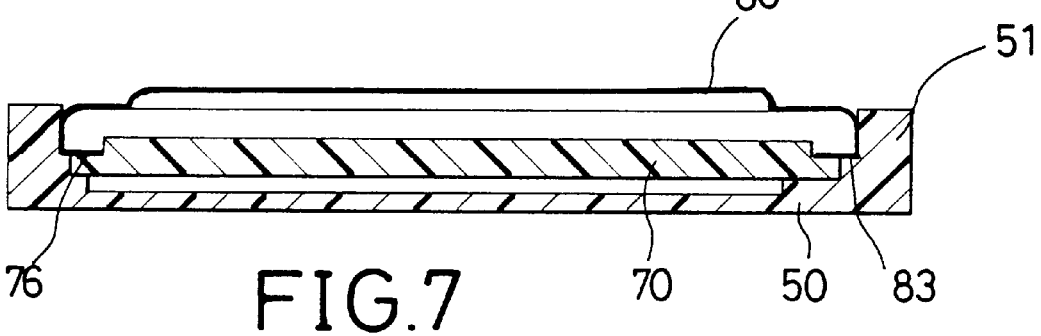
Figure 8:
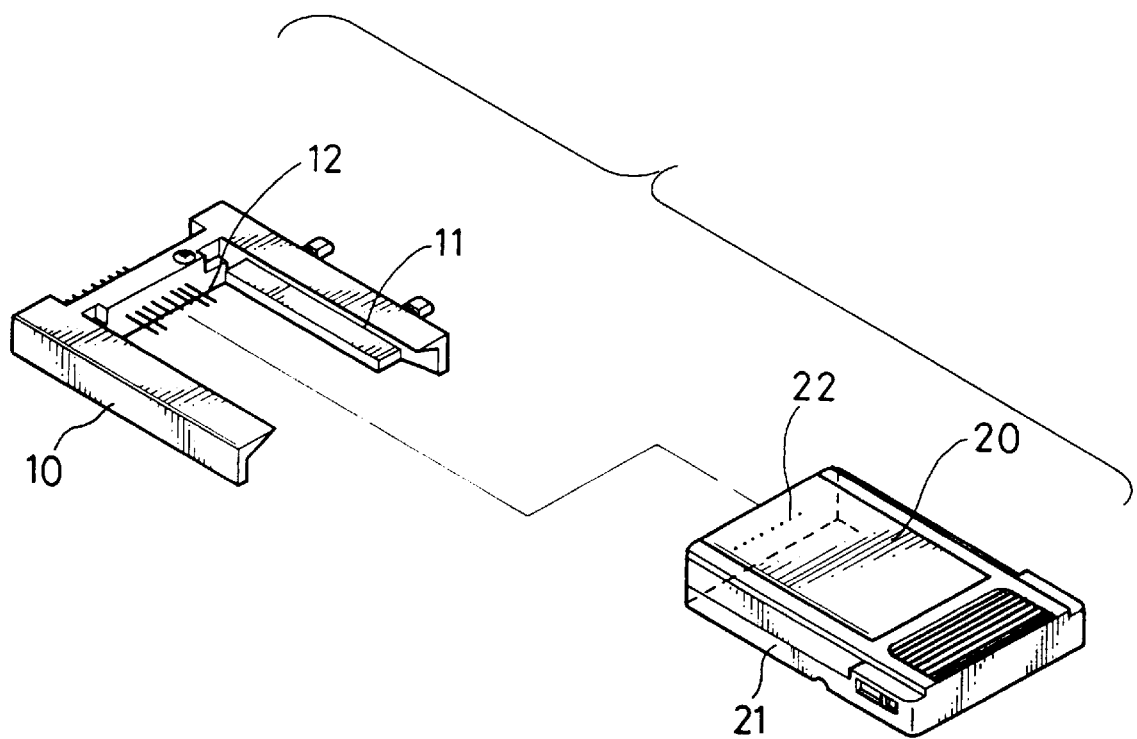
FIG. 8 is a schematic view showing the corporation of a conventional memory cassette and a connector.

DETAILED DESCRIPTION OF THE PREFERRED EMBODIMENT:

Referring to FIGS. 1 and FIG. 2, it is noted that a memory adapter 40 constructed in accordance with the present invention is shown. The memory cassette 40 has a top cover 50, a bottom cover 80 detachably connected with the top cover 50, a cover sheet 70 detachably connected with the bottom cover 80 and a circuit board 60 detachably received between the top cover 50 and the cover sheet 70. The top cover 50 has two opposed walls (56), a first cutout 51 defined in a front portion of each of the walls, a second cutout 52 defined in an end face thereof, a pair of indentations 551 defined in an outer face of the two walls, a pair of first protrusions 53 respectively formed on an inner face defining the first cutout 51, a pair of second protrusions 54 respectively formed on an inner face of the walls and a pair of third protrusions 55 respectively formed on an outer face defining the indentation 551. The circuit board 60 has a front portion 61 adapted to be received within the second cutout 52 of the top cover 50 and having a plurality of holes 611 defined in a face thereof, a pair of limitations 62 respectively formed on opposite sides thereof and a contacting area 63 electrically connected to each one of the holes 611. The cover sheet 70 has a front portion 701 adapted to mate with the first cutout 51 of the top cover 50 when assembly and having two opposed legs 75 each provided with a depression 751 corresponding to one of the first protrusions 53 of the top cover 50 and defined in an outer face thereof and a channel 752 defined in an inner face thereof and corresponding to one of the limitations 62 of the circuit board 60, a window 71 defined therein and corresponding to the contacting area 63 of the circuit board 60, two recesses 76 defined in a face thereof. Furthermore, the cover sheet 70 has a cutout 73 defined to correspond to the second cutout 52 of the top cover 50, so that when the cover sheet 70 and the top cover 50 are assembled, the cutout 73 of the cover sheet 70 and the second cutout 52 of the top cover 50 define an opening. The bottom cover 80 has two opposed flanges 81 extending downward therefrom, and each of the flanges has a first opening 82 defined therein and corresponding to one of the first protrusions 53 of the top cover 50, a bend 83 inward formed therewith and corresponding to one of the recess 76, an extension 84 having two opposed ends each provided with a second opening 85 defined therein and corresponding to one of the third protrusions 55 of the top cover 50. It is appreciated that the extension 84 has a width equal to a width of the top cover 50 and a width between the opposed flanges 81 is equal to a width between the inner faces of the two opposed walls, such that the extension 84 of the bottom cover 80 is able to securely engage with the top cover 50 via the connection between the second opening 85 and the pair of third protrusions 55 and the flanges 81 are able to be securely connected with the opposed wall of the top cover 50 via the connection between the first opening 82 and the pair of second protrusions 54 after the circuit board 60 and the cover sheet 70 are assembled with the top cover 50.

When in assembly, referring to FIGS. 3 to 7, the circuit board 60 is placed within the space defined by the second cutout 52. Because a width of the front portion 61 of the circuit board 60 is the same as a width of the second cutout 52, the front portion 61 of the circuit board 60 and the second cutout 52 of the top cover 50 are assembled flush. When mating the cover sheet 70 with the top cover 50, the front portion 701 of the cover sheet 70 is adapted to be flush with a height of the two opposed walls of the top cover 50 due to the provision of the first cutout 51 of the top cover 50. The limitations 62 will be securely received in the corresponding channels 752 of the cover sheet 70 and the opposed pair of first protrusions 53 will be received in the corresponding depressions 751 of the cover sheet 70 and the contacting area 63 of the circuit board 60 is exposed through the window 71 when assembled with the top cover 50, the circuit board 60 and the cover sheet 70 is completed. Finally, when the bottom cover 80 is assembled with the cover sheet 70, due to the width between the opposed flanges 81 being equal to the width between the opposed inner faces of the two opposed walls of the top cover 50 and the width of the extension 84 being equal to the width between the outer faces of the opposed walls of the top cover 50, so that the first protrusions 53 are able to be respectively received in one of the corresponding first openings 82 and the third protrusions 55 are able to be respectively received in one of the corresponding second openings 85. Furthermore, the bottom cover 80 is able to force the cover sheet 70 to be securely attached to the top cover 50 via the abutment of the pair of bends 83 at the corresponding recesses 76 of the cover sheet 70.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the fill extent indicated by the broad general meaning of the terms in which the appended claims are expressed.

What is claimed is:

1. A memory adapter comprising:
    a first cover having a pair of opposed walls each provided with a first protrusion and a second protrusion formed on an inner face of the wall and a third protrusion formed on an outer face of the wall, a first cutout defined in a front portion thereof, a second cutout defined in an end face thereof and an indentation defined in the outer face where the third protrusion is formed;
    a circuit board within the first cover and a front portion thereof being received in the second cutout and having a pair of opposed limitations formed on opposite sides thereof, a plurality of holes defined in an end face thereof and a contacting area electrically connected with the holes; and
    a second cover having a front portion configured to correspond to and mate with the first cutout of the first cover, a window defined to correspond to the contacting area of the circuit board, a cutout defined to correspond to the second cutout of the first cover and two legs extending downward and each of which has a depression defined in an outer face thereof and corresponding to one of the limitations and a channel defined in an inner face thereof and corresponding to one of the first protrusions of the first cover;
    whereby a cassette memory is able to be inserted into the adapter and electrically connected with the contacting area of the circuit board.

2. The memory adapter as claimed in claim 1 further comprising a pair of opposed recesses defined in a face of the second cover and a third cover adapted to be detachably connected with the first cover and abutted the second cover to the first cover.

3. The memory adapter as claimed in claim 2, wherein the third cover comprises a pair of opposite flanges extending downward therefrom and having a pair of first openings respectively defined to correspond to and detachably connected with the second protrusions of the first cover and a pair of bends respectively formed with one of the flanges and extending inward to correspond to and abut the second cover via disposed in the recesses of the second cover.

4. The memory adapter as claimed in claim 2, wherein the third cover comprises an extension formed therewith and having a pair of opposed second openings respectively defined to correspond to and detachably receiving one of the indentations of the first cover therein.

5. The memory adapter as claimed in claim 2, wherein a width between the flanges is equal to a width between inner faces of the walls.

6. The memory adapter as claimed in claim 4, wherein a width of the extension is equal to a width between outer faces of the walls.

* * * * *